(12) United States Patent
Almomani et al.

(10) Patent No.: US 11,713,594 B2
(45) Date of Patent: *Aug. 1, 2023

(54) ELECTRONIC LOCK WITH MISALIGNMENT SCORING SYSTEM

(71) Applicant: Spectrum Brands, Inc., Middleton, WI (US)

(72) Inventors: Nedal Almomani, Mission Viejo, CA (US); Matthew Lovett, Lake Forest, CA (US); Timothy Brewer, San Diego, CA (US)

(73) Assignee: Spectrum Brands, Inc., Middleton, WI (US)

( * ) Notice: Subject to any disclaimer, the term of this patent is extended or adjusted under 35 U.S.C. 154(b) by 420 days.

This patent is subject to a terminal disclaimer.

(21) Appl. No.: 16/920,020

(22) Filed: Jul. 2, 2020

(65) Prior Publication Data

US 2021/0010293 A1     Jan. 14, 2021

Related U.S. Application Data

(63) Continuation of application No. 15/361,621, filed on Nov. 28, 2016, now Pat. No. 10,704,293.

(Continued)

(51) Int. Cl.
    *E05B 47/00*            (2006.01)
    *E05B 47/02*            (2006.01)
    (Continued)

(52) U.S. Cl.
    CPC ........ *E05B 47/0001* (2013.01); *E05B 47/026* (2013.01); *G01R 31/34* (2013.01);
    (Continued)

(58) Field of Classification Search
    CPC ................. E05B 47/0012; E05B 47/02; E05B 2047/0058; E05B 2047/0065;
    (Continued)

(56) References Cited

U.S. PATENT DOCUMENTS

| | | | | |
|---|---|---|---|---|
| 3,181,036 A | * | 4/1965 | Harris | H01H 43/12 361/173 |
| 4,727,301 A | * | 2/1988 | Fulks | E05B 77/28 292/DIG. 3 |

(Continued)

FOREIGN PATENT DOCUMENTS

| | | |
|---|---|---|
| CN | 2222209 Y | 3/1996 |
| CN | 2014033977 Y | 3/2008 |

(Continued)

OTHER PUBLICATIONS

European Search Report for Application No. 16871333.7, dated Jun. 26, 2019.

*Primary Examiner* — Christine M Mills
*Assistant Examiner* — Faria F Ahmad
(74) *Attorney, Agent, or Firm* — Merchant & Gould P.C.

(57) ABSTRACT

An electronic lock with a lock assembly that includes a bolt movable between an extended position and a retracted position. The electronic lock includes a motor configured to drive the bolt between the extended position and the retracted position. A controller is provided that is configured to control actuation of the motor to selectively move the bolt between the extended position and the retracted position. The electronic lock includes a user interface configured to output information about the electronic lock. A misalignment scoring means is provided for detecting interference to movement of the bolt between the extended position and the retracted position and determining a lock misalignment score based on the detected interference. The user interface identifies the lock misalignment score.

20 Claims, 5 Drawing Sheets

Related U.S. Application Data

(60) Provisional application No. 62/261,564, filed on Dec. 1, 2015.

(51) Int. Cl.
 *G01R 31/44* (2020.01)
 *G01R 31/34* (2020.01)

(52) U.S. Cl.
 CPC .......... *G01R 31/44* (2013.01); *E05B 47/0012* (2013.01); *E05B 47/02* (2013.01); *E05B 2047/0069* (2013.01); *E05B 2047/0097* (2013.01); *Y10T 292/1021* (2015.04)

(58) Field of Classification Search
 CPC ..... E05B 2047/0097; E05B 2047/0069; E05B 47/00011; E05B 47/026; Y10T 292/1021; G01R 31/34; G01R 31/44
 See application file for complete search history.

(56) References Cited

U.S. PATENT DOCUMENTS

| | | | | |
|---|---|---|---|---|
| 4,744,021 A | * | 5/1988 | Kristy | G07C 9/00182 |
| | | | | 700/12 |
| 4,868,467 A | * | 9/1989 | Davis | G01R 31/34 |
| | | | | 318/400.03 |
| 5,681,070 A | * | 10/1997 | Williams | E05B 47/0047 |
| | | | | 292/201 |
| 5,694,798 A | * | 12/1997 | Nunez | E05B 47/0661 |
| | | | | 70/277 |
| 6,212,923 B1 | | 4/2001 | Clark | |
| 6,950,033 B1 | * | 9/2005 | Guyre | E05B 45/12 |
| | | | | 340/687 |
| 8,807,605 B1 | | 8/2014 | Dudley et al. | |
| 9,580,934 B2 | * | 2/2017 | Baty | E05B 47/02 |
| 9,958,838 B2 | | 5/2018 | Zacharko et al. | |
| 2002/0060458 A1 | * | 5/2002 | Roatis | E05B 47/0012 |
| | | | | 292/199 |
| 2002/0083747 A1 | * | 7/2002 | Beylotte | E05B 17/0029 |
| | | | | 70/257 |
| 2005/0102113 A1 | | 5/2005 | Miracle et al. | |
| 2008/0223093 A1 | | 9/2008 | Amir | |
| 2010/0032969 A1 | | 2/2010 | Blanch | |
| 2010/0127517 A1 | * | 5/2010 | Bliding | E05C 17/04 |
| | | | | 292/341.16 |
| 2011/0080685 A1 | | 4/2011 | Wellner et al. | |
| 2011/0291848 A1 | * | 12/2011 | Burdenko | E05B 15/0245 |
| | | | | 340/665 |
| 2012/0119523 A1 | * | 5/2012 | Burdenko | E05B 63/122 |
| | | | | 29/592 |
| 2012/0167646 A1 | | 7/2012 | Sharma et al. | |
| 2014/0021725 A1 | | 1/2014 | Baty et al. | |
| 2014/0054904 A1 | * | 2/2014 | Andrews | E05C 19/163 |
| | | | | 292/144 |
| 2015/0020180 A1 | | 1/2015 | Ngan et al. | |
| 2015/0115622 A1 | * | 4/2015 | Burdenko | E05B 47/026 |
| | | | | 307/43 |
| 2015/0330120 A1 | * | 11/2015 | Hogan | E05B 15/0205 |
| | | | | 292/138 |
| 2018/0340350 A1 | | 11/2018 | Johnson et al. | |
| 2018/0340352 A1 | | 11/2018 | Compton | |
| 2018/0340354 A1 | | 11/2018 | Beck | |

FOREIGN PATENT DOCUMENTS

| | | |
|---|---|---|
| WO | 2004020769 A1 | 3/2004 |
| WO | 2015138726 A1 | 9/2015 |

\* cited by examiner

ELECTRONIC LOCK WITH MISALIGNMENT SCORING SYSTEM

RELATED APPLICATIONS

This application is a continuation of U.S. application Ser. No. 15/361,621, filed Nov. 28, 2016, now U.S. Pat. No. 10,704,293; which claims the benefit of U.S. Provisional Application Ser. No. 62/261,564, filed Dec. 1, 2015, which applications are hereby incorporated by reference in their entireties.

TECHNICAL FIELD

The present disclosure relates generally to electronic locks; in particular, this disclosure relates to an electronic lock with a misalignment scoring system. In some aspects, this disclosure provides a method of testing for misalignment issues in a lock's installation.

BACKGROUND

Electronic locks are well known. Some electronic locks operate in conjunction with an access control system, such as a home automation or home security system, while others operate in a stand-alone manner. Many electronic locks, such as electronic deadbolts, include a bolt that is driven by a motor between a retracted (unlocked) position and an extended (locked) position.

One of the challenges with electronic locks is misalignment of the lock face with respect to the door. If there is interference with movement of the bolt due to poor installation, environmental factors, building settling, etc., operation of the lock is negatively impacted. This problem often presents itself as an early low battery indication after installation. The early loss of battery life is caused by the increased load on the motor to overcome the side load from the door to drive the bolt between locked/unlocked positions. In some cases, the misalignment may completely prevent the motor from driving the bolt, which can be particularly problematic if the user is attempting to remotely operate the lock.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
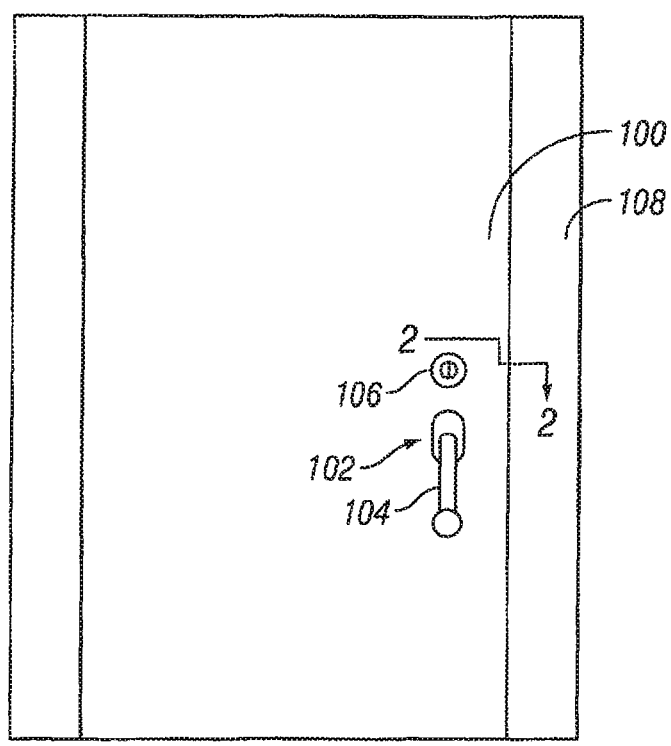
FIG. 1 is a front view of a door with an example electronic lock according to an embodiment of this disclosure.

The figures and descriptions provided herein may have been simplified to illustrate aspects that are relevant for a clear understanding of the herein described devices, systems, and methods, while eliminating, for the purpose of clarity, other aspects that may be found in typical devices, systems, and methods. Those of ordinary skill may recognize that other elements and/or operations may be desirable and/or necessary to implement the devices, systems, and methods described herein. Because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

In illustrative embodiments, an electronic lock is provided with a misalignment scoring system that indicates a level of interference experienced by the bolt as it moves between its extended and retracted positions. The misalignment score provides direct feedback during lock installation or when a user activates the misalignment test. The score enables the user or installer to take action to improve the lock's performance, which could extend the battery life and improve operation of the lock.

FIG. 1 is a front view of a door, which could be an interior or exterior door. In this example, the door 100 has a lockset 102 with a handle 104 and an electronic deadbolt 106. The electronic deadbolt 106 is shown solely for purposes of example and this disclosure applies equally to other types of electronic locks with a bolt. A door jamb 108 is adjacent the door 100. The door 100 is shown solely for purposes of example and this disclosure applies equally to other types of doors that utilize a deadbolt.

Figure 2:
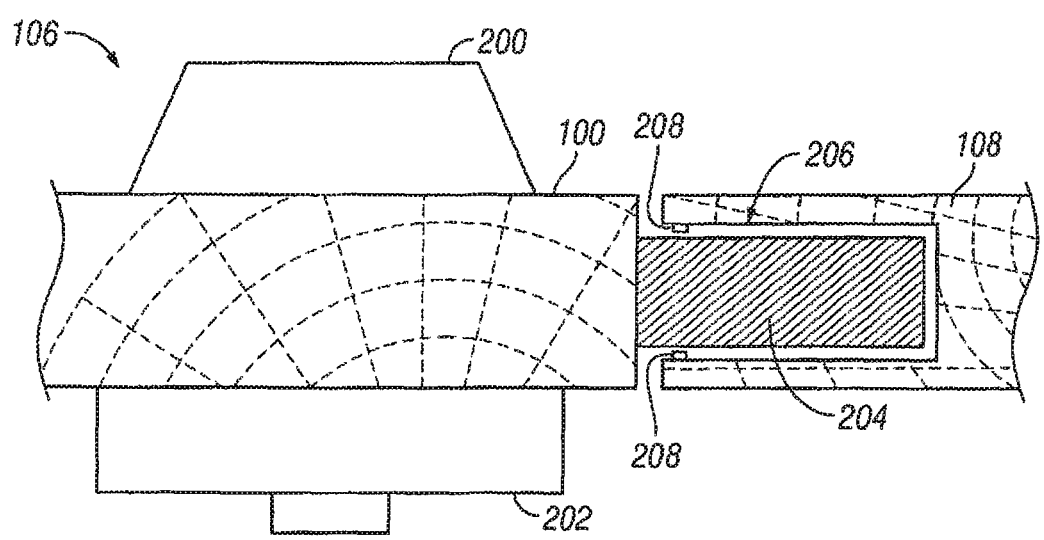
FIG. 2 is a cross-sectional view along line 2-2 of FIG. 1.

Referring to FIG. 2, the electronic deadbolt 106 includes an exterior assembly 200 and an interior assembly 202. The electronic deadbolt 106 includes a bolt 204 that is selectively extended/retracted to lock/unlock the door 100 with a motor 300 (FIGS. 3 and 4), depending on whether the user has locked/unlocked the electronic deadbolt 106. Examples of electronic deadbolts with motors that move a bolt between extended and retracted positions are described in U.S. Pat. No. 9,024,759 filed Mar. 14, 2014 for a "Wireless Lockset with Integrated Antenna, Touch Activation, and Light Communication Method" and U.S. Application Publication No. 2014/0250956 filed Feb. 25, 2014 for an "Electronic Deadbolt," both of which are hereby incorporated by reference.

As shown, the bolt 204 is in the extended position in which the bolt 204 extends through a strike plate 208 into a side bore 206 in the door jamb 108. If the bolt 204 is misaligned, interference from the door jamb 108 and/or strike plate 208 as the bolt 204 moves between its extended and retracted positions could negatively impact performance of the electronic deadbolt 106. In addition to misalignment of the bolt 204 due to the door jamb 108 and/or strike plate 208, if the side bore 206 is not of constant width there can be an increasing side load as the bolt 204 extends into the side bore 206. For example, the interference could require increased torque from the motor 300 to overcome the side load of the door jamb 108 and/or strike plate 206, which would reduce battery life. If the interference from the door jamb 108 and/or strike plate 206 is sufficiently bad, this could completely prevent the motor 300 from driving the bolt 204. As discussed below, the electronic deadbolt 106 includes a misalignment scoring system that rates the level of interference with a lock misalignment score. By using the lock misalignment score during installation (or later when desired), a misalignment can be rectified and performance of the electronic deadbolt 106, including battery life, can be improved.

Figure 3:
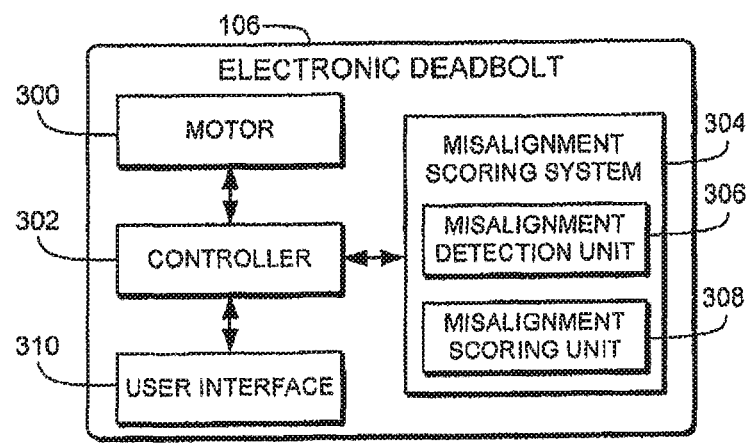
FIG. 3 is a simplified block diagram showing components of an example electronic lock in a stand-alone configuration according to an embodiment of this disclosure.
Figure 4:
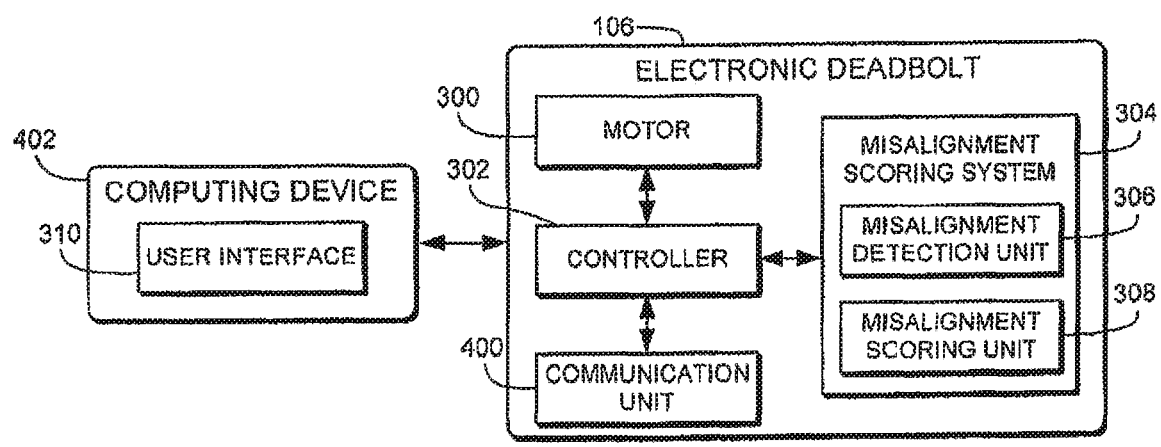
FIG. 4 is a simplified block diagram showing components of an example electronic lock in a networked configuration according to an embodiment of this disclosure.

FIGS. 3 and 4 are block diagrams showing certain electrical components of an example electronic deadbolt 106. FIG. 3 shows an illustrative embodiment of a stand-alone configuration, while FIG. 4 is an example embodiment of a networked configuration. In the embodiments shown, the electronic deadbolt 106 includes a motor 300 for driving the bolt 204 between its extended and retracted positions. As shown, a controller 302 controls actuation of the motor 300 to drive the bolt 204. For example, the controller 302 could actuate the motor 300 to drive the bolt 204 to the retracted position responsive to a user entering a proper authentication code. Likewise, the controller 302 could actuate the motor 300 to drive the bolt 204 to the extended position responsive to receiving a command from a user to lock the electronic deadbolt 106. The controller 302 may be embodied as any type of processor capable of performing the functions described herein. For example, the controller 302 may be embodied as a single or multi-core processor(s), digital signal processor, microcontroller, or other processor or processing/controlling circuit.

As shown, the electronic deadbolt 106 includes a misalignment scoring system 304 with a misalignment detection unit 306 and a misalignment scoring unit 308. Upon entering into a misalignment testing mode, the misalignment scoring system 304 is configured to determine a lock misalignment score that is based, at least in part, on a level of interference to movement of the bolt 204 between its extended and retracted positions. The term "lock misalignment score" is broadly intended to encompass any rating of interference with movement of the bolt between its extended (locked) and retracted (unlocked) positions, including but not limited to interference caused by installation issues and/or internal issues with the electronic deadbolt that interfere with movement of the bolt. For example, the interference could be caused by the door jamb and/or strike plate due to installation issues and/or interference internal to the electronic lock that interferes with movement of the bolt even if the alignment with the door is good. The lock misalignment score could be, but is not necessarily, a numerical value. For example, the lock misalignment score could be "low," "medium," or "high." By way of other non-numeric examples, the lock misalignment score could be a graphical representation, audible indication and/or haptic feedback that indicate a level of interference. In some embodiments, the lock misalignment score could be tied to lock functionality. For example, a score of "1" could signify one month of battery life, while a score of "12" could signify twelve months of battery life.

The misalignment detection unit 306 is configured to detect a level of interference in bolt movement between its extended and retracted positions. There are several means by which a level of interference in bolt movement could be detected. For example, the misalignment detection unit could measure at least one physical characteristic of the motor while driving the bolt between the extended position and the retracted position. In some embodiments, the misalignment detection unit 306 could include an electrical sensor to detect a current, voltage, and/or power drawn by the motor 300 in driving the bolt 204 between its extended/retracted positions. In other embodiments, the misalignment detection unit 306 could include a torque sensor to detect an amount of torque exerted by the motor 300 to drive the bolt 204 between its extended/retracted positions.

The misalignment scoring unit 308 is configured to take the data measured by the misalignment detection unit 306 and determine a lock misalignment score. For example, a current, voltage, power and/or torque measurement made by the misalignment detection unit 306 could be compared with a baseline measurement, which would represent no interference, and the lock misalignment score could increase as the current, voltage, power and/or torque needed by the motor 300 to drive the bolt 204 increased from the baseline measurement. There are numerous ways of establishing a baseline measurement. In some embodiments, the baseline measurement could be established during installation by actuating the bolt 204 between its extended and retracted positions with the door open. Embodiments are also contemplated in which the baseline measurement could be established during production of the electronic deadbolt 106 during factory calibration of the lock and stored in memory. By way of another example, the baseline measurement could be established during an initial handing process of the electronic deadbolt 106 when the lock is first installed. In some cases, the baseline measurement could be a programmed constant that was established through empirical measurements. In some embodiments, the comparison with the baseline measurement could be made on absolute measurements. For example, a peak current, voltage, power and/or torque level could be compared with that of the baseline measurement to determine a lock misalignment score. By way of another example, a rate of change of the current, voltage, power and/or torque measurement could be used to determine a level of interference. For example, there may be different current, voltage, power and/or torque levels during the operation of the motor through various phases of driving the bolt (e.g., starting motor, driving bolt, stopping motor, etc.). The measurements during various phases of the motor's operation could be compared with the baseline to determine the lock misalignment score.

As mentioned above, FIG. 3 shows an embodiment of a stand-alone electronic deadbolt 106 with a user interface 310 on the electronic deadbolt 106. FIG. 4 shows an example embodiment in which at least a portion of the user interface 310 is off-loaded from the electronic deadbolt 106 onto a separate device. In the example shown, the electronic deadbolt 106 includes a communication unit 400 that communicates with a computing device 402, which provides at least a portion of the user interface 310. The communication unit 400 may be configured to use any one or more communication technology (e.g., wired or wireless communications) and associated protocols (e.g., Ethernet, Bluetooth®, Wi-Fi®, WiMAX, Zigbee®, Z-Wave®, etc.) to effect such communication. The computing device 402 may be embodied as, without limitation, a computer, a workstation, a server computer, a laptop computer, a notebook computer, a tablet computer, a smartphone, a mobile computing device, a desktop computer, a distributed computing system, a multiprocessor system, a consumer electronic device, a smart appliance, and/or any other computing device capable of providing a user interface. By way of an example, the user interface 310 could include an app on a mobile device through which a user could interact with the electronic deadbolt 106. Although the example in FIG. 4 shows the user interface 310 entirely off-loaded to the separate computing device as an example, a portion of the user interface 310 could still reside on the electronic deadbolt 106 and only a portion on the computing device 402.

In some embodiments, the lock misalignment score is intended to be a consumer or installer facing feature that can be used during installation (or at a later date) to rectify a misalignment. Embodiments are also contemplated in which the lock misalignment score could be communicated to a backend service (e.g., through the communication unit 400) where other usage and performance logs are collected to trigger a service call or as a resource to customer support staff. The user interface 310 conveys the lock misalignment score to the user. The manner by which the user interface 310 interacts with (or outputs information to) the user could be visual, audible, and/or haptic. In an embodiment in which the lock misalignment score is conveyed visually, for example, the user interface 310 could include LEDs in which a certain number (e.g., 3 out of 5) are illuminated to convey the score. In an example in which the electronic deadbolt 106 includes a keypad, the score could be conveyed by illuminating certain keys on the keypad. In a further example in which the electronic deadbolt 106 or the computing device 402 includes a display, the score could be shown on the display. In an embodiment in which the score is conveyed in an audible manner, the user interface 310 could include a speaker in which a sound conveys the score, such as by a number of beeps, a volume level, a frequency and/or a digitized voice. In an embodiment in which the score is conveyed in a haptic manner, the score could be conveyed based on a vibration pattern, intensity, etc. One skilled in the art should appreciate that many types of user interfaces could be used to convey the lock misalignment score and this disclosure is not intended to be limited to any specific example provided above. In some embodiments, the user interface 310 could be used for other functions related to the lock misalignment score. For example, the user interface 310 could include an interface element for a user to select to enter into a misalignment testing mode. For example, the user interface 310 could be a switch on the electronic deadbolt 106 for initiating the misalignment testing mode. In some cases, such as when the user interface 310 includes a display, a graphical user interface element, such as a button, could be used to enter into the misalignment testing mode. For example, the user interface 310 could include a menu from which a user could select a "misalignment test." Likewise, the user interface 310 could be used to prompt the user during the misalignment testing, such as to open/close the door and/or indicate that the door has been opened/closed.

Figure 5:
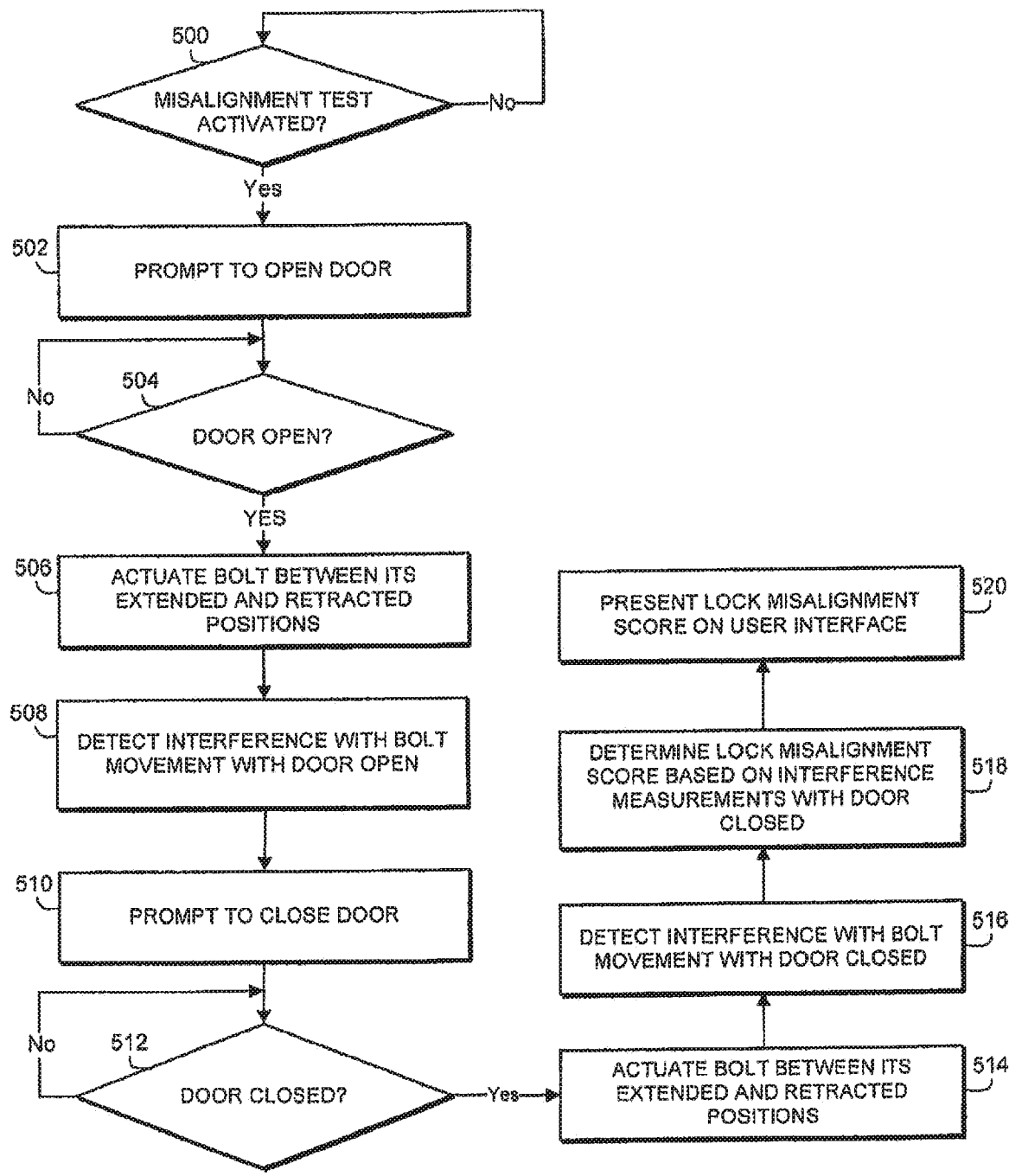
FIG. 5 is a simplified flowchart showing a method of testing for misalignment issues of a lock's installation according to an embodiment of this disclosure.

FIG. 5 illustrates a method the electronic deadbolt 106 could execute during use to determine a lock misalignment score. The method begins with block 500 in which the controller 302 determines whether a misalignment testing mode has been activated. As mentioned above, the misalignment test could be activated using an element of the user interface 310, such as a switch or button, for the user to actuate for the electronic deadbolt 106 to enter into the misalignment testing mode. If the misalignment test has been activated, the method advances to block 502 in which the user is prompted to open the door 100. The method advances to block 504 in which a determination is made whether the door 100 has been opened. For example, a user may actuate an interface element, such as a switch or button, on the user interface 310 to indicate that the door has been opened. In some embodiments, a sensor could be used to determine whether the door 100 has been opened. If the door 100 has been opened, the method advances to block 506 in which the controller 302 actuates the motor 300 to drive the bolt 204 between its extended and retracted positions with the door 100 open. While the bolt 204 is being moved between its extended and retracted positions, the misalignment detection unit 306, in block 508, detects interference with the bolt 204, which allows a baseline level of interference with the bolt to be established. Subsequently, at block 510, the user is prompted to close the door 100 through the user interface 310. Although this example describes an initial interference test with the door 100 open and then closed, this could be performed vice versa with the door 100 initially closed and then open. The method advances to block 512 in which a determination is made whether the door has been closed. If the door 100 has been closed, the method advances to block 514 in which the controller 302 actuates the motor 300 to drive the bolt 204 between its extended and retracted positions with the door 100 closed. While the bolt 204 is being moved between its extended and retracted positions, the misalignment detection unit 306, in block 516, detects interference with the bolt 204. The method advances to block 518 in which the misalignment scoring unit 308 determines a lock misalignment score based on the interference measurements. This score is presented to the user on the user interface 310, at block 520, which provides direct feedback for the user/installer to tweak alignment of the bolt 204 with respect to the door jamb 108 depending on the lock misalignment score.

Figure 6:
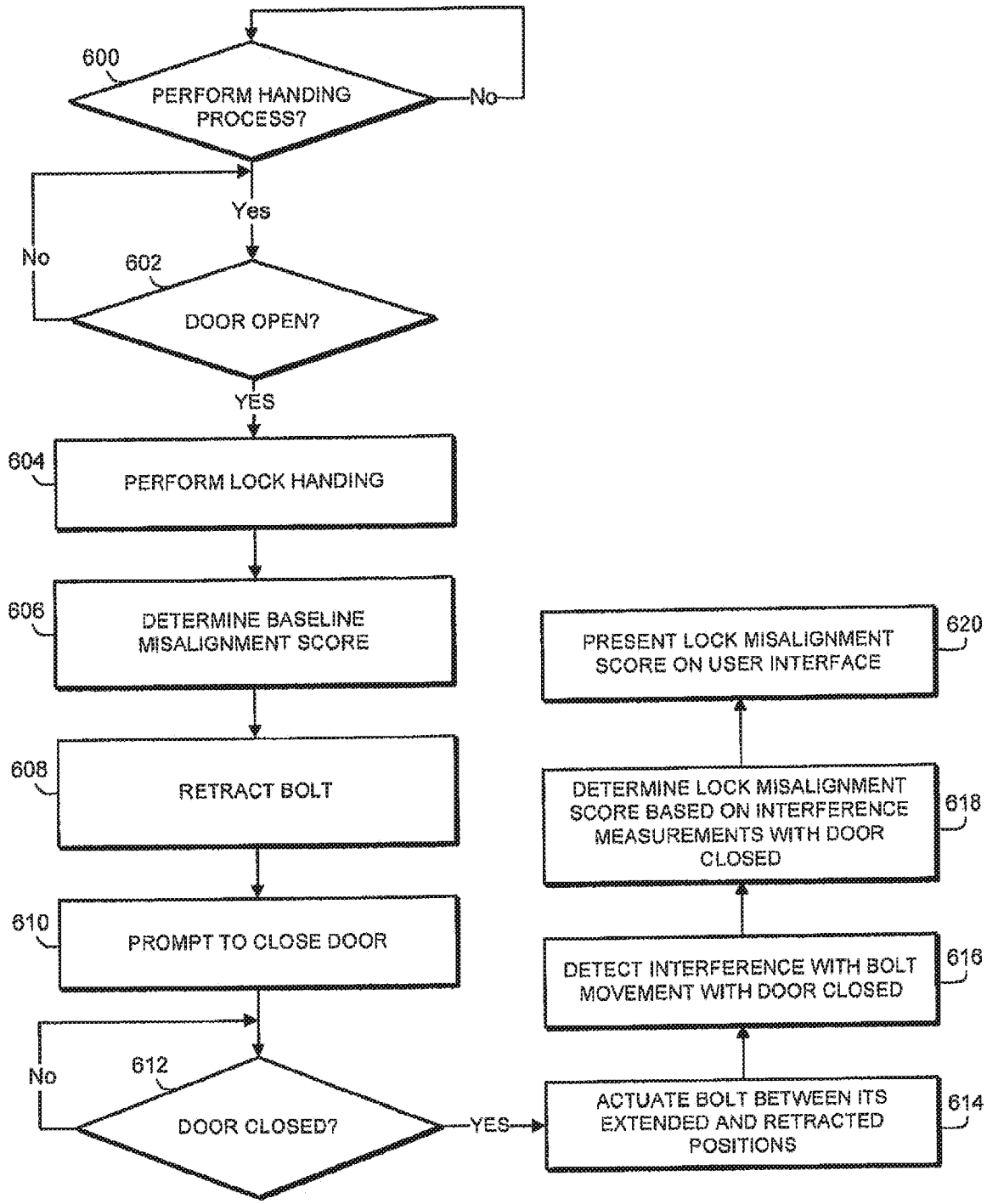
FIG. 6 is a simplified flowchart showing a method of testing for misalignment in conjunction with a door handing process.

FIG. 6 illustrates a method the electronic deadbolt 106 could execute during use to determine a lock misalignment score in conjunction with a door handing process. The method begins with block 600 in which the controller 302 determines whether a door handing process has been activated, which could be user-selected, such as a button on user interface 310, or could occur automatically upon power-up, such as when a user inserts batteries into the electronic deadbolt 106. A door handing process determines whether the electronic deadbolt 106 has been mounted to the left side or right side of the door, which affects a direction of movement for the bolt 204 between its locked and unlocked positions. If the door handing process has been activated, the method advances to block 602 in which a determination is made whether the door 100 has been opened. If the door 100 has been opened, the method advances to block 604 in which the controller 302 actuates the door handing process, which moves the bolt 204 between its extended and retracted positions with the door 100 open. While the bolt 204 is being moved between its extended and retracted positions, the misalignment detection unit 306, in block 606, detects interference with the bolt 204, which allows a baseline level of interference with the bolt to be established. Subsequently, at block 608, the bolt 204 is moved to the retracted position. The user is then, at block 610, prompted to close the door 100 through the user interface 310. The method advances to block 612 in which a determination is made whether the door has been closed. If the door 100 has been closed, the method advances to block 614 in which the controller 302 actuates the motor 300 to drive the bolt 204 between its extended and retracted positions with the door 100 closed. While the bolt 204 is being moved between its extended and retracted positions, the misalignment detection unit 306, in block 616, detects interference with the bolt 204. The method advances to block 618 in which the misalignment scoring unit 308 determines a lock misalignment score based on the interference measurements. This score is presented to the user on the user interface 310, at block 620, which provides direct feedback for the user/installer to tweak alignment of the bolt 204 with respect to the door jamb 108 depending on the lock misalignment score.

Figure 7:
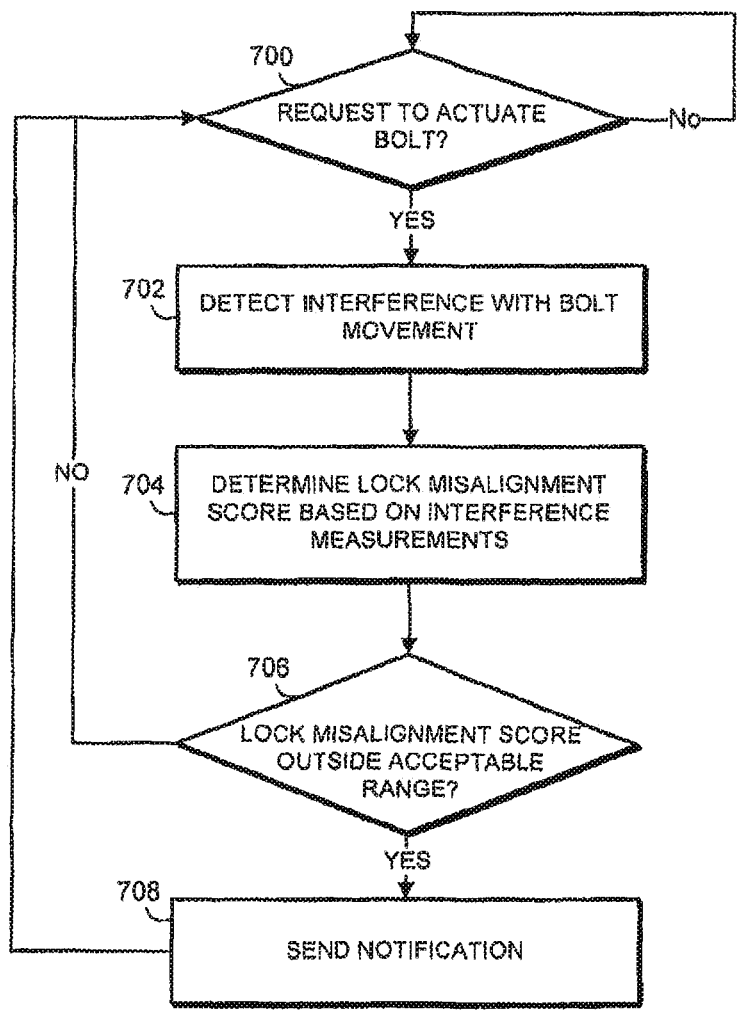
FIG. 7 is a simplified flowchart showing a method of detecting misalignment during lock operation.

FIG. 7 illustrates a method the electronic deadbolt 106 could execute during use to determine if a lock misalignment score is outside an acceptable range. For example, the electronic deadbolt 106 could determine a lock misalignment score each time the bolt 204 moves between its retracted/extended positions (or periodically as the bolt 204 moves) and send an error message notification if the score is outside an acceptable range. In this example, the method begins with block 700 in which the controller 302 receives a request to actuate the bolt 204. Upon receiving such a request, the method advances to block 702 in which the misalignment detection unit 306 detects interference with the bolt 204 as it is actuated between its extended and retracted positions. Subsequently, at block 704, the misalignment scoring unit 308 determines a lock misalignment score based on the interference measurements. The method advances to block 706 in which a determination is made whether the lock misalignment score is outside an acceptable range. If the score is within an acceptable range, the method loops back to block 700. If the misalignment score is outside an acceptable range, the method advances to block 708 in which a notification is sent regarding the lock misalignment score. For example, a notification could be communicated to the user, such as through a mobile app associated with the electronic deadbolt 106, through a back-end service (e.g., through the communication unit 400) where other usage and performance logs are collected to trigger a service call, through a blinking light or audible beep and/or other local error message.

EXAMPLES

Illustrative examples of the technologies disclosed herein are provided below. An embodiment of the technologies may include any one or more, and any combination of, the examples described below.

Example 1 is an electronic lock with a lock assembly including a bolt movable between an extended position and a retracted position. The lock includes a motor configured to drive the bolt between the extended position and the retracted position. A controller is provided that is configured to control actuation of the motor to selectively move the bolt between the extended position and the retracted position. A user interface is provided configured to output information about the electronic lock. The lock includes misalignment scoring means for detecting interference to movement of the bolt between the extended position and the retracted position and determining a lock misalignment score based on the detected interference. The user interface identifies the lock misalignment score.

In Example 2, the subject matter of Example 1 is further configured in which the misalignment scoring means measures at least one physical characteristic of the motor while driving the bolt between the extended position and the retracted position.

In Example 3, the subject matter of Example 2 is further configured in which the at least one physical characteristic includes a measurement of an absolute voltage, current, and/or power drawn by the motor while driving the bolt between the extended position and the retracted position.

In Example 4, the subject matter of Example 2 is further configured so that the at least one physical characteristic includes a measurement of a rate of change in voltage, current, and/or power drawn by the motor while driving the bolt between the extended position and the retracted position.

In Example 5, the subject matter of Example 2 is further configured in which the at least one physical characteristic includes a measurement of a torque exerted by the motor while driving the bolt between the extended position and the retracted position.

In Example 6, the subject matter of Example 1 is further configured in which the misalignment scoring means compares a baseline interference measurement with a current interference measurement to determine the lock misalignment score.

In Example 7, the subject matter of Example 6 is further configured in which the baseline interference measurement is established by: (1) an interference measurement taken while a door onto which the locking assembly being installed is open; (2) an interference measurement taken during calibration of the electronic lock; (3) an interference measurement taken during a handing process of the electronic lock; and/or (4) storing a predetermined value in a memory of the electronic lock.

In Example 8, the subject matter of Example 7 is further configured in which the current interference measurement is based on an interference measurement taken while a door onto which the locking assembly is installed is closed.

Example 9 is an electronic lock with a lock assembly including a bolt movable between an extended position and a retracted position and a motor configured to drive the bolt between these positions. A controller is provided that is configured to control actuation of the motor to selectively move the bolt between the extended position and the retracted position. The controller is configured to enter into a misalignment testing mode. A user interface is provided that is configured to output information about the electronic lock. The electronic lock includes a misalignment scoring system configured to determine a lock misalignment score responsive to the controller entering into the misalignment testing mode. The misalignment scoring system determines the lock misalignment score based on interference to movement of the bolt between the extended position and the retracted position. The user interface includes a user-selectable element configured to switch the controller to the misalignment testing mode.

In Example 10, the subject matter of Example 9 is further configured such that the misalignment scoring system includes a misalignment detection unit configured to detect interference to movement of the bolt between the extended position and the retracted position.

In Example 11, the subject matter of Example 10 is further configured such that the misalignment detection unit includes at least one electrical sensor for detecting voltage, current, and/or power drawn by the motor while driving the bolt between the extended position and the retracted position.

In Example 12, the subject matter of Example 11 is further configured such that the misalignment scoring system determines the lock misalignment score based, at least in part, on (1) a measurement of a rate of change in voltage, current, and/or power drawn by the motor while driving the bolt between the extended position and the retracted position; and/or (2) an absolute voltage, current, and/or power drawn by the motor while driving the bolt between the extended position and the retracted position.

In Example 13, the subject matter of Example 10 is further configured such that the misalignment detection unit includes at least one torque sensor configured to detect a torque exerted by the motor to drive the bolt between the extended position and the retracted position.

In Example 14, the subject matter of Example 13 is further configured such that the misalignment scoring system determines the lock misalignment score based, at least in part, on a measurement of a torque exerted by the motor while driving the bolt between the extended position and the retracted position.

In Example 15, the subject matter of Example 9 is further configured such that the lock misalignment score is a numeric value.

In Example 16, the subject matter of Example 9 is further configured such that the lock misalignment score is a non-numeric value.

In Example 17, the subject matter of Example 9 is further configured such that the lock misalignment score represents an estimated life expectancy of a power source associated with the electronic lock.

In Example 18, the subject matter of Example 9 is further configured such that the user interface is configured to identify the lock misalignment score in a visual, audible, and/or haptic manner.

In Example 19, the subject matter of Example 9 is further configured such that the user interface includes a user-selectable element configured to represent a door position associated with the lock assembly.

In Example 20, the subject matter of Example 9 is further configured such that the misalignment scoring system is configured to determine a lock misalignment score responsive to the controller actuating the motor.

Example 21 provides a method of testing for misalignment issues in a lock's installation. The method includes providing an electronic lock with a motor configured to drive a bolt between an extended position and a retracted position. A lock misalignment score is determined with at least one processor based on interference to movement of the bolt moving between the extended position and the retracted position. The lock misalignment score is communicated with at least one processor to a user interface associated with the electronic lock.

In Example 22, the subject matter of Example 21 further including measuring interference to movement of the bolt between the extended position and the retracted position while a door associated with the electronic lock is in both an open and a closed position.

In Example 23, the subject matter of Example 22 further includes prompting on the user interface to move a door associated with the electronic lock to an open and/or a closed position.

In Example 24, the subject matter of Example 23 further includes actuating the bolt between the extended position and the retracted position responsive to detecting that a door associated with the electronic lock has been moved to an open and/or a closed position.

In Example 25, the subject matter of Example 24 is further configured such that detecting that the door associated with the electronic lock is open or closed is based on actuation of a user-selectable element on the user interface.

In Example 26, the subject matter of Example 21 further includes entering, with at least one processor, into a misalignment testing mode that initiates determination of the lock misalignment score responsive to actuation of a user-selectable element of the user interface.

In Example 27, the subject matter of Example 21 is further configured such that determining a lock misalignment score includes measuring at least one physical characteristic of the motor while driving the bolt between the extended position and the retracted position.

In Example 28, the subject matter of Example 27 is further configured such that measuring at least one physical characteristic of the motor includes: (1) a measurement of a rate of change in voltage, current, and/or power drawn by the motor while driving the bolt between the extended position and the retracted position; (2) a measurement of an absolute voltage, current, and/or power drawn by the motor while driving the bolt between the extended position and the retracted position; and/or (3) a measurement of a torque exerted by the motor while driving the bolt between the extended position and the retracted position.

Although the present disclosure has been described with reference to particular means, materials and embodiments, from the foregoing description, one skilled in the art can easily ascertain the essential characteristics of the present disclosure and various changes and modifications may be made to adapt the various uses and characteristics without departing from the spirit and scope of the present invention as set forth in the following claims

The invention claimed is:
1. An electronic lock comprising:
a lock assembly including a bolt movable between an extended position and a retracted position;
a motor configured to drive the bolt between the extended position and the retracted position;
a controller configured to control actuation of the motor to selectively move the bolt between the extended position and the retracted position, wherein based on a level of interference to movement of the bolt between the extended position and the retracted position, the controller is configured to determine a lock misalignment score, wherein the lock misalignment score represents an estimated life expectancy of a power source associated with the electronic lock; and
a user interface configured to output information about the lock misalignment score.

2. The electronic lock of claim 1, wherein the user interface includes a user-selectable element configured to selectively activate the controller to determine the lock misalignment score.

3. The electronic lock of claim 1, further comprising at least one sensor configured to measure at least one physical characteristic of the motor while driving the bolt between the extended position and the retracted position.

4. The electronic lock of claim 3, wherein the at least one physical characteristic of the motor includes one or more of current, voltage, power, and torque measurements.

5. The electronic lock of claim 3, wherein the level of interference is based at least partially on a measurement of one or more of current, voltage, power, and torque.

6. The electronic lock of claim 1, wherein the user interface is remotely coupled in communication with the controller housed at the electronic lock.

7. The electronic lock of claim 1, wherein the lock misalignment score is tied to functionality of the electronic lock.

8. An electronic lock comprising:
a lock assembly including a bolt movable between an extended position and a retracted position;
a motor configured to drive the bolt between the extended position and the retracted position;
a controller configured to control actuation of the motor to selectively move the bolt between the extended position and the retracted position, wherein the controller is configured to enter into a misalignment testing mode;
a user interface configured to output information about the electronic lock; and
a misalignment scoring system including a misalignment detection unit including at least one electrical sensor for detecting voltage, current, and/or power drawn by the motor while driving the bolt between the extended position and the retracted position, the misalignment scoring system configured to determine a lock misalignment score responsive to the controller entering into the misalignment testing mode, wherein the misalignment scoring system determines the lock misalignment score based on interference to movement of the bolt between the extended position and the retracted position,
wherein the user interface includes a user-selectable element configured to activate the misalignment testing mode, and
wherein the lock misalignment score corresponds to an estimated life expectancy of a power source associated with the electronic lock.

9. The electronic lock of claim 8, wherein the misalignment scoring system determines the lock misalignment score based, at least in part, on (1) a measurement of a rate of change in voltage, current, and/or power drawn by the motor while driving the bolt between the extended position and the retracted position; and/or (2) an absolute voltage, current, and/or power drawn by the motor while driving the bolt between the extended position and the retracted position.

10. The electronic lock of claim 8, wherein the misalignment scoring system indicates a level of interference experienced by the bolt as it moves between the extended position and the retracted position.

11. The electronic lock of claim 8, wherein the lock misalignment score is tied to lock functionality.

12. The electronic lock of claim 8, wherein the lock misalignment score is numerical.

13. The electronic lock of claim 8, wherein the lock misalignment score is non-numerical.

14. The electronic lock of claim 8, wherein the lock misalignment score is based on a measurement due to movement of the bolt between the extended position and the retracted position and a baseline measurement.

15. A method of testing for misalignment during installation of an electronic lock, the method comprising:
providing the electronic lock with a motor configured to drive a bolt between an extended position and a retracted position, the electronic lock also having a user interface;
activating a misalignment test via the user interface;
determining a baseline level of interference of the bolt when moving between the extended position and the retracted position;
actuating the bolt between the extended position and the retracted position, and while the bolt is moving between the extended position and the retracted position, detecting interference with the bolt;
determining a lock misalignment score based on the detected interference and the baseline interference; and
verifying that the lock misalignment score is with within an acceptable range to complete the misalignment test.

16. The method of claim 15, wherein if the lock misalignment score is outside the acceptable range, the method further comprises communicating a notification of misalignment of the electronic lock to the user interface.

17. The method of claim 15, wherein determining the baseline level of interference includes:
prompting on the user interface to move a door associated with the electronic lock to an open position; and
actuating the bolt between the extended position and the retracted position, and while the bolt is moving between the extended position and the retracted position, detecting the baseline interference with the bolt.

18. The method of claim 17, wherein actuating the bolt for detecting interference with the bolt occurs while the door is in a closed position.

19. The method of claim 15, wherein determining the baseline level of interference includes performing a factory calibration and storing the baseline level of interference at the electronic lock.

20. The method of claim 15, further comprising presenting the lock misalignment score on the user interface, wherein the lock misalignment score corresponds to an estimated life expectancy of a power source associated with the electronic lock.

* * * * *